(12) United States Patent
Kim et al.

(10) Patent No.: US 11,257,899 B2
(45) Date of Patent: Feb. 22, 2022

(54) FILM STRUCTURE INCLUDING HAFNIUM OXIDE, ELECTRONIC DEVICE INCLUDING THE SAME, AND METHOD OF MANUFACTURING THE SAME

(71) Applicant: Samsung Electronics Co., Ltd., Suwon-si (KR)

(72) Inventors: Haeryong Kim, Seongnam-si (KR); Jungmin Park, Seoul (KR); Yongsung Kim, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/895,362

(22) Filed: Jun. 8, 2020

(65) Prior Publication Data

US 2021/0183993 A1 Jun. 17, 2021

(30) Foreign Application Priority Data

Dec. 13, 2019 (KR) .......................... 10-2019-0167139

(51) Int. Cl.
*H01L 49/02* (2006.01)
*H01L 29/78* (2006.01)
(Continued)

(52) U.S. Cl.
CPC ............ *H01L 28/60* (2013.01); *H01L 21/022* (2013.01); *H01L 21/02181* (2013.01);
(Continued)

(58) Field of Classification Search
CPC .............. H01L 28/60; H01L 29/78391; H01L 21/02181; H01L 21/022; H01L 21/02318; H01L 28/90; H01L 29/516; H01L 29/517
See application file for complete search history.

(56) References Cited

U.S. PATENT DOCUMENTS 8,049,305 B1 * 11/2011 Miller .................. H01L 23/525
257/537
8,564,925 B2 10/2013 Six
(Continued)

FOREIGN PATENT DOCUMENTS

JP H08287515 A 11/1996
JP 2008-006818 A 1/2008
(Continued)

OTHER PUBLICATIONS

Thomas Begou et al., "Accurate analysis of mechanical stress in dielectric multilayers", Optics Letters, vol. 42, No. 16, pp. 3217-3220, Aug. 11, 2017.
(Continued)

*Primary Examiner* — Mohammad M Choudhry
(74) *Attorney, Agent, or Firm* — Harness, Dickey & Pierce, P.L.C.

(57) ABSTRACT

Provided are a film structure including hafnium oxide, an electronic device including the same, and a method of manufacturing the same. The film structure including hafnium oxide includes a hafnium oxide layer including hafnium oxide crystallized in a tetragonal phase, and first and second stressor layers apart from each other with the hafnium oxide layer therebetween and applying compressive stress to the hafnium oxide layer.

26 Claims, 16 Drawing Sheets

(51) Int. Cl.
    *H01L 21/02*     (2006.01)
    *H01L 27/108*     (2006.01)
    *H01L 29/51*     (2006.01)

(52) U.S. Cl.
    CPC .. *H01L 21/02318* (2013.01); *H01L 27/10805* (2013.01); *H01L 28/90* (2013.01); *H01L 29/516* (2013.01); *H01L 29/517* (2013.01); *H01L 29/78391* (2014.09)

(56) References Cited

U.S. PATENT DOCUMENTS

| | | | |
|---|---|---|---|
| 8,901,706 | B2 | 12/2014 | Chudzik et al. |
| 2006/0051978 | A1* | 3/2006 | Li .......................... H01L 28/40 |
| | | | 438/785 |
| 2006/0084201 | A1* | 4/2006 | Hasper ................ C23C 16/4581 |
| | | | 438/108 |
| 2008/0303068 | A1* | 12/2008 | Grill ..................... H01L 27/092 |
| | | | 257/288 |
| 2013/0175665 | A1 | 7/2013 | Chudzik et al. |
| 2016/0005961 | A1 | 1/2016 | Ino |
| 2017/0033217 | A1* | 2/2017 | Hong ................ H01L 29/7848 |
| 2018/0122679 | A1 | 5/2018 | Roy et al. |
| 2018/0315811 | A1 | 11/2018 | Cho et al. |
| 2019/0013391 | A1 | 1/2019 | Moon et al. |
| 2019/0067126 | A1* | 2/2019 | Chen .................. H01L 27/0924 |
| 2019/0074295 | A1* | 3/2019 | Schroder .............. H01L 29/516 |

FOREIGN PATENT DOCUMENTS

| | | |
|---|---|---|
| JP | 2009-251167 A | 10/2009 |
| KR | 10-0659029 B1 | 12/2006 |
| KR | 10-1315080 B1 | 10/2013 |
| KR | 10-1504800 | 3/2015 |
| KR | 10-2018-0046898 A | 5/2018 |

OTHER PUBLICATIONS

L. Xu et al., "General relationship for cation and anion doping effects on ferroelectric HfO HfO2 formation", IEDM 16, 608-611, Dec. 1, 2016.

Dongwon Shin et al., "Thermodynamicmodeling of the Hf—Si—O system", Computer Coupling Phase Diagrams and Thermochemistry, 2018.

Osamu Ohtaka et al., "Phase Relations and Volume Changes of Hafnia under High Pressure and High Temperature", Journal of the American Ceramic Society, vol. 84, No. 6, pp. 1369-1373, Jun. 2001.

Tran Doan Huan et al., "Pathways towards ferroelectricity in hafnia", Physical Review B 90, Aug. 27, 2014.

Si Joon Kim et al., "Large ferroelectric polarization of TiN/Hf0.5Zr0.5O2/TiN capacitors due to stress-induced crystallization at low thermal budget", Applied Physics Letters 111, Dec. 12, 2017.

The extended European Search Report dated Dec. 8, 2020 in European Application No. 20183695.4.

* cited by examiner

FIG. 3

| MATERIAL | Constant of Thermal Expansion coefficient (m/K) |
|---|---|
| $HfO_2$ | $4.4 \times 10^{-6}$ |
| $TiO_2$ | $9.0 \times 10^{-6}$ |
| $SiO_2$ | $0.5 \times 10^{-6}$ |
| $Ta_2O_5$ | $3.6 \times 10^{-6}$ |
| $Nb_2O_5$ | $7.7 \times 10^{-6}$ |
| $WO_3$ | $5.7 \times 10^{-6}$ |
| $FeO$ | $12.2 \times 10^{-6}$ |
| $Fe_2O_3$ | $14.9 \times 10^{-6}$ |
| $NiO_x$ | $17.1 \times 10^{-6}$ |
| $CoO_x$ | $15.0 \times 10^{-6}$ |
| $Cr_2O_3$ | $7.3 \times 10^{-6}$ |
| $Cu_2O$ | $4.3 \times 10^{-6}$ |

FILM STRUCTURE INCLUDING HAFNIUM OXIDE, ELECTRONIC DEVICE INCLUDING THE SAME, AND METHOD OF MANUFACTURING THE SAME

CROSS-REFERENCE TO RELATED APPLICATION

This application claims the benefit of Korean Patent Application No. 10-2019-0167139, filed on Dec. 13, 2019, in the Korean Intellectual Property Office, the disclosure of which is incorporated herein in its entirety by reference.

BACKGROUND

1. Field

Embodiments set forth herein relate to a film structure including hafnium oxide, an electronic device including the same, and a method of manufacturing the same.

2. Description of Related Art

As integrated circuit devices are downscaled, the space available to the electronic devices included therein (e.g., transistors, capacitors, and the like), also decreases. Thus, materials helpful for overcoming such spatial limitations and/or that exhibit good operating characteristics are beneficial for the downscaling of integrated circuit devices.

Hafnium oxide is a key material used as a high-K material for electronic devices. Studies are being actively conducted on various doping materials, crystals, and the like to increase the dielectric constant or stability of a hafnium oxide thin film. Hafnium oxide thin film doped with Zr, Si, Al, La, Y, or the like may exhibit ferroelectricity at a certain thickness thereof or less. Ferroelectricity may cause a negative capacitance effect and thus may reduce power consumption of electronic devices using a ferroelectric material.

Accordingly, research has been actively conducted into low-power logic devices, nonvolatile memory, capacitors, and the like, using hafnium oxide-based dielectric materials.

SUMMARY

Provided are a film structure including hafnium oxide exhibiting a high dielectric constant, a method of manufacturing the same, and an electronic device using the same.

Additional aspects will be set forth in part in the description that follows and, in part, will be apparent from the description, or may be learned by practice of the presented embodiments of the disclosure.

According to an aspect of an embodiment, a film structure with hafnium oxide includes a first stressor layer, a hafnium oxide layer on the first stressor layer, the hafnium oxide layer including hafnium oxide crystallized in a tetragonal phase, and f a second stressor layer on the hafnium oxide layer the first stressor layer and the second stressor layer configured to apply compressive stress to the hafnium oxide layer during heating.

The hafnium oxide crystallized in the tetragonal phase may be 50% to 95% of the hafnium oxide layer.

The hafnium oxide layer may further include hafnium oxide crystallized in at least one of an orthorhombic phase or a monoclinic phase.

A content of the specific gravity of the hafnium oxide crystallized in the at least one of the orthorhombic phase or the monoclinic phase may be 20% or less of the hafnium oxide layer.

At least one of the first and second stressor layers may have a thermal expansion coefficient greater than that of the hafnium oxide layer.

The thermal expansion coefficient of at least one of the first stressor layer or second stressor layer may be 1.5 times or greater than the thermal expansion coefficient of the hafnium oxide layer.

The thermal expansion coefficient of at least one of the first stressor layer or second stressor layer may be 7 μm/K or greater.

At least one of the first stressor layer or second stressor layer may include at least one of titanium oxide, iron oxide, nickel oxide, cobalt oxide, or chromium oxide.

Each of the first stressor layer and the second stressor layer may be in direct contact with the hafnium oxide layer.

At least one of the first stressor layer or second stressor layer may include a conductive material.

At least one of the first stressor layer or the second stressor layer may have a thickness less than that of the hafnium oxide layer.

At least one of the first stressor layer and second stressor layer has a thickness of 2 nm or less.

The hafnium oxide layer may have a thickness of about 5 to 7 nm.

The hafnium oxide layer may be include a dopant with an ionic radius lower than that of hafnium ions.

The dopant may include at least one ion of Li, Be, Mg, Al, Si, Ti, V, Cr, Mn, Fe, Co, Ni, Cu, Zn, Co, Ge, Nb, Mo, Tc, Ru, Rh, Pd, Sn, Sb, Ta, W, Re, Os, Ir, Pt, Bi, or Po.

The hafnium oxide layer may have a dielectric constant of about 30 to 70.

According to an aspect of another embodiment, an electronic device includes a conductive layer, and a film structure as described above on the conductive layer.

The conductive layer may include a metal material.

The electronic device may include at least one of a capacitor or a transistor.

According to an aspect of another embodiment, a method of manufacturing a film structure includes forming a first stressor layer, a hafnium oxide layer on the first stressor layer, the hafnium oxide layer including hafnium oxide, and a second stressor layer on the hafnium oxide layer, the second stressor layer spaced apart from the first stressor with the hafnium oxide layer therebetween and the first and second stressor layers having a thermal expansion coefficient greater than that of the hafnium oxide layer; and heat-treating the first stressor layer, the hafnium oxide layer and the second stressor layer such that the first and second stressor layers apply compressive stress to the hafnium oxide layer.

The heat-treating of the first stressor layer, the hafnium oxide layer and the second stressor layer may include heating the first stressor layer, the hafnium oxide layer and the second stressor layer to between about 400° C. and 600° C.

At least part of the hafnium oxide of the heat-treated hafnium oxide layer may be crystallized in a tetragonal phase.

The hafnium oxide crystallized in the tetragonal phase may be 50% to 95% of the hafnium oxide layer.

The heat-treated hafnium oxide layer may be include at least one of an orthorhombic phase or a monoclinic phase.

The hafnium oxide crystallized in the at least one of the orthorhombic phase or the monoclinic phase may comprise 20% or less of the hafnium oxide layer.

The thermal expansion coefficients of the first and second stressor layers may be 1.5 times or more than the thermal expansion coefficient of the hafnium oxide layer.

The thermal expansion coefficient of the first and second stressor layers may be 7 μm/K or greater.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 3 illustrates thermal expansion coefficients of oxides according to an embodiment;

DETAILED DESCRIPTION

Figure 1:
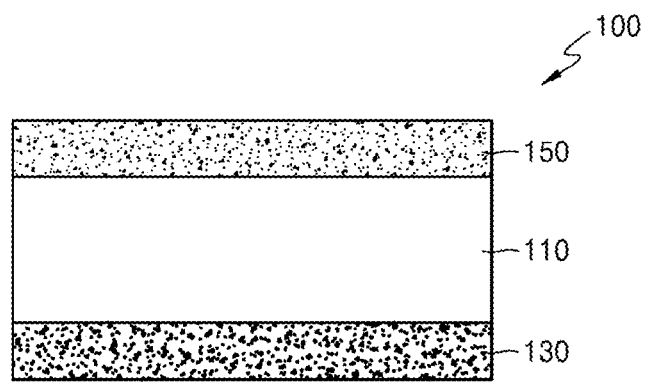
FIG. 1 is a cross-sectional view of a film structure including hafnium oxide according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. Embodiments described below are merely examples and various modifications may be made therein. In the drawings, the same reference numerals represent the same elements, and a size of each element may be exaggerated for clarity and convenience of description.

As used herein, the term "on" or "above" an element may be understood to mean that the element can be directly on another element or be on another element not in contact with the other element.

The terms 'first', 'second,' etc. may be used to describe various elements but are only used herein to distinguish one element from another element. These terms are not intended to limit materials or structures of elements.

As used herein, the singular expressions are intended to include plural forms as well, unless the context clearly dictates otherwise. It will be understood that when an element is referred to as "including" another element, the element may further include other elements unless mentioned otherwise.

The term "the" and demonstratives similar thereto may be understood to include both singular and plural forms.

When the terms "approximately" or "substantially" are used in this specification in connection with a numerical value, it is intended that the associated numerical value include a tolerance of ±10% around the stated numerical value. When ranges are specified, the range includes all values therebetween such as increments of 0.1%.

Unless explicitly stated that operations of a method should be performed in an order described below, the operations may be performed in an appropriate order. In addition, all terms indicating examples (e.g., etc.) are only for the purpose of describing technical ideas in detail, and thus the scope of the present disclosure is not limited by these terms unless limited by the claims.

FIG. 1 is a cross-sectional view of a film structure 100 including hafnium oxide according to an embodiment. Referring to FIG. 1, the film structure 100 may include a hafnium oxide layer 110 including hafnium oxide, and first and second stressor layers 130 and 150, which are apart from each other with the hafnium oxide layer 110 therebetween and apply compressive stress to the hafnium oxide layer 110.

The hafnium oxide layer 110 may include crystallized hafnium oxide ($HfO_x$), for example hafnium dioxide ($HfO_2$). In general, hafnium oxide ($HfO_x$) may have various types of crystalline phases.

Figure 2A:
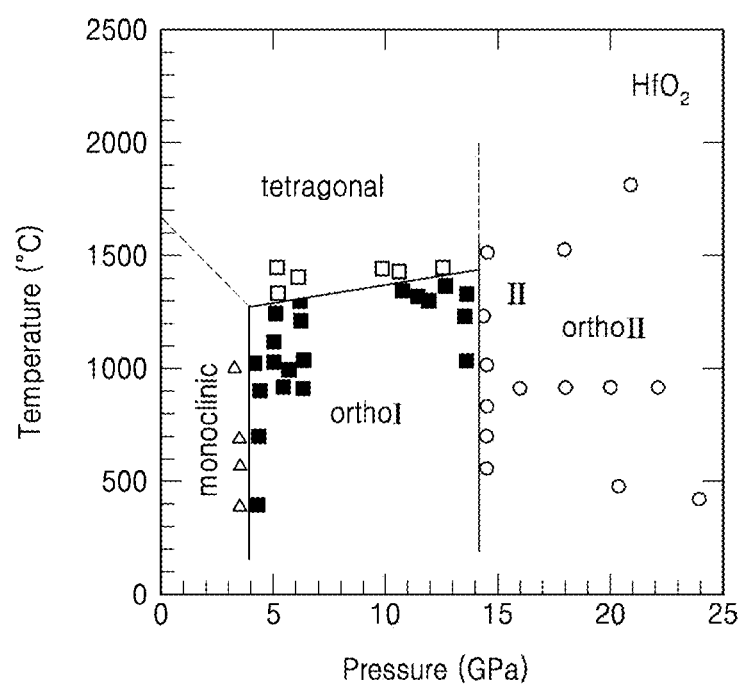
FIG. 2A is a phase transition graph of hafnium oxide according to an embodiment.

FIG. 2A is a phase transition graph of hafnium oxide according to an embodiment. As illustrated in FIG. 2A, the hafnium oxide may have a monoclinic phase, an orthorhombic phase, and/or a tetragonal phase. The phase of the hafnium oxide may vary according to the temperature and pressure applied thereto.

Figure 2B:
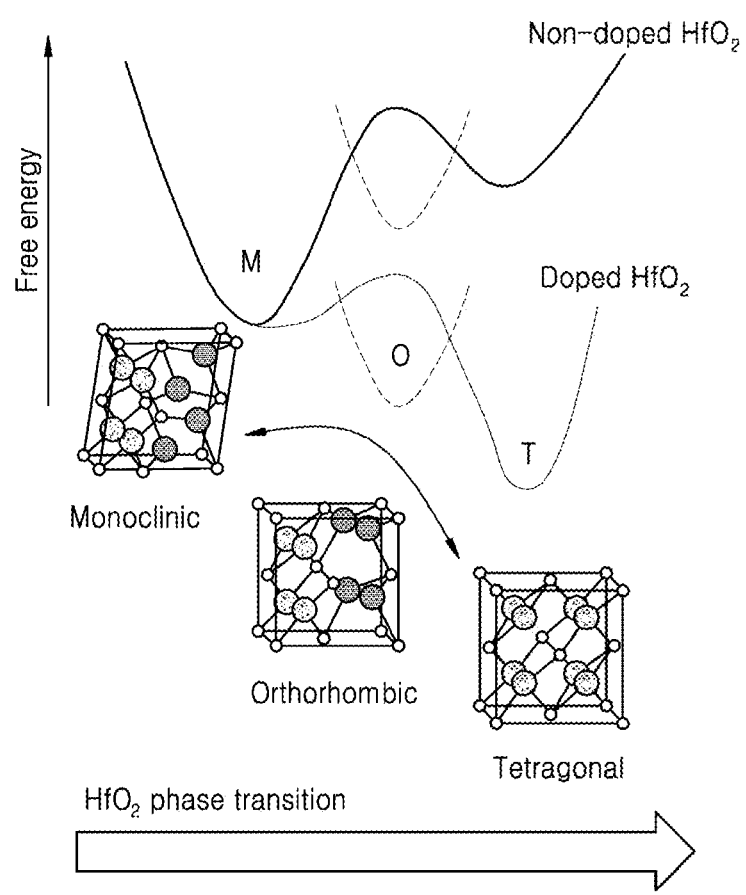
FIG. 2B is a diagram illustrating the relationship between a crystalline phase and free energy of hafnium oxide according to an embodiment.

FIG. 2B is a diagram illustrating the relationship between a crystalline phase and free energy of hafnium oxide according to an embodiment. As illustrated in FIG. 2B, free energy is smallest when hafnium oxide crystallized in a tetragonal phase is doped.

In one embodiment, hafnium oxide of the hafnium oxide layer 110 may include a tetragonal phase. A content of the hafnium oxide crystallized in the tetragonal phase may be in a range of 50% to 95% of the hafnium oxide layer 110. As content ratio of the hafnium oxide crystallized in the tetragonal phase increases, the hafnium oxide layer 110 may maintain a stable state and thus have a high dielectric constant.

The hafnium oxide layer 110 may include hafnium oxide crystallized in an orthorhombic phase or a monoclinic phase. For example, the displacement space between regions wherein the hafnium oxide crystallized in the tetragonal phase may be filled with hafnium oxide crystallized in the orthorhombic phase or the monoclinic phase. A content of hafnium oxide crystallized in the orthorhombic phase or the monoclinic phase may be lower than that of hafnium oxide crystallized in the tetragonal phase. For example, the content of the hafnium oxide crystallized in the orthorhombic phase and/or the monoclinic phase may be 30% or less of the hafnium oxide layer 110.

The hafnium oxide layer 110 may have a thickness of, for example, about 5 nm to about 7 nm. The hafnium oxide layer 110 may have a high dielectric constant when crystallized at a thickness of 7 nm or less and may be used, for example, as a ferroelectric film in either a ferroelectric field-effect transistor or a capacitor. In one embodiment, the hafnium oxide layer 110 may have a high dielectric constant of 30 to 70.

The first and second stressor layers 130 and 150 may be apart from each other with the hafnium oxide layer 110 therebetween and apply compressive stress to the hafnium oxide layer 110. The thickness of each of the first and second stressor layers 130 and 150 may be less than the thickness of the hafnium oxide layer 110. For example, the first and/or second stressor layer may have a thickness of 2 nm or less. The combined thickness of the first and second stressor layers 130 and 150 may also be less than the thickness of the hafnium oxide layer therebetween. The first and second stressor layers 130 and 150 may be in direct contact with the hafnium oxide layer 110. The thermal expansion coefficients of the first and/or the second stressor layers 130 and 150 may be greater than that of the hafnium oxide layer 110. For example, the thermal expansion coefficient of at least one of the first stressor layer 130 or the second stressor layer 150 may be 1.5 times greater than that of the hafnium oxide layer 110. Alternatively, the thermal expansion coefficient of at least one of the first stressor layer 130 or the second stressor layer 150 may be 7 μm/K or greater.

The first and second stressor layers 130 and 150 may include oxides. For example, at least one of the first stressor layer 130 or the second stressor layer 150 may include at least one of titanium oxide, iron oxide, nickel oxide, cobalt oxide, chromium oxide, or combination thereof. However, embodiments are not limited thereto. The first and second stressor layers 130 and 150 may include a metal material. For example, at least one of the first stressor layer 130 or the second stressor layer 150 may include titanium, tungsten, molybdenum, nickel, or the like.

FIG. 3 illustrates thermal expansion coefficients of oxides according to an embodiment. As shown in FIG. 3, oxides may have a unique thermal expansion coefficient. For example, the thermal expansion coefficient of $HfO_2$ is about $4.4*10^{-6}$ m/K. As the stressor layers may have a thermal expansion coefficient greater than that of $HfO_2$, the first and second stressor layers 130 and 150 may be formed, for example, of $TiO_2$, $Nb_2O_5$, $WO_3$, FeO, or the like.

The first and second stressor layers 130 and 150 may include a conductive material or a dielectric material. When the first and second stressor layers 130 and 150 include a conductive material, the first and second stressor layers 130 and 150 may function as electrodes. When the first and second stressor layers 130 and 150 include a dielectric material, the first and second stressor layers 130 and 150 may serve as dielectric films, together with the hafnium oxide layer 110. Alternatively, one of the first and second stressor layers 130 and 150 may include a conductive material and the other may include a dielectric material.

The hafnium oxide layer 110 and the first and second stressor layers 130 and 150 may expand due to a heat treatment performed during the manufacture of the film structure 100. Because the coefficients of thermal expansion of the first and second stressor layers 130 and 150 are greater than that of the hafnium oxide layer 110, the first and second stressor layers 130 and 150 may apply compressive stress to the hafnium oxide layer 110. The hafnium oxide in the hafnium oxide layer 110 may be crystallized in the tetragonal phase due to the compressive stress.

As described above, the hafnium oxide may have the monoclinic phase, the orthorhombic phase, and/or the tetragonal phase. Hafnium oxide crystallized in the tetragonal phase has low free energy and, thus, is stable. The hafnium oxide is also likely to be crystallized in the monoclinic phase at low temperatures and low pressures. However, in order to crystallize hafnium oxide into the tetragonal phase, the hafnium oxide has to be heated to a high temperature and/or under high pressure. For example, the hafnium oxide may be crystallized in the tetragonal phase when heated to 1200° C. or more and/or under pressures of about 3 GPa or greater.

However, the properties of other materials, for example, metals, may change at 1200° C., making it difficult to manufacture an electronic device with tetragonal hafnium oxide. In order to improve the above problem, attempts have been made to reduce the temperature of the heat treatment by changing the free energy of hafnium oxide by adding a dopant thereto, but a high-temperature process performed at 700° C. or higher is required nevertheless.

In one embodiment, in the film structure 100, a stressor layer having a large thermal expansion coefficient is provided on the hafnium oxide layer 110 so that the hafnium oxide in the hafnium oxide layer 110 may be crystallized into the tetragonal phase due to the compressive stresses from the stressor layer during a heat treatment process.

The hafnium oxide layer 110 may further include a dopant. The dopant may have a smaller ionic radius than that of hafnium ions. For example, the dopant may be ions such as Ti, V, Cr, Mn, Fe, Co, Ni, Cu, Zn, Co, Ge, Nb, Mo, Tc, Ru, Rh, Pd, Sn, Sb, Ta, W, Re, Os, Ir, Pt, Bi, Po, or the like. The dopant may further stabilize the hafnium oxide crystallized in the tetragonal phase. Alternatively, the hafnium oxide may include a dopant having a radius smaller than a length of a bond between the hafnium and oxygen to stabilize the hafnium oxide.

Figure 4:
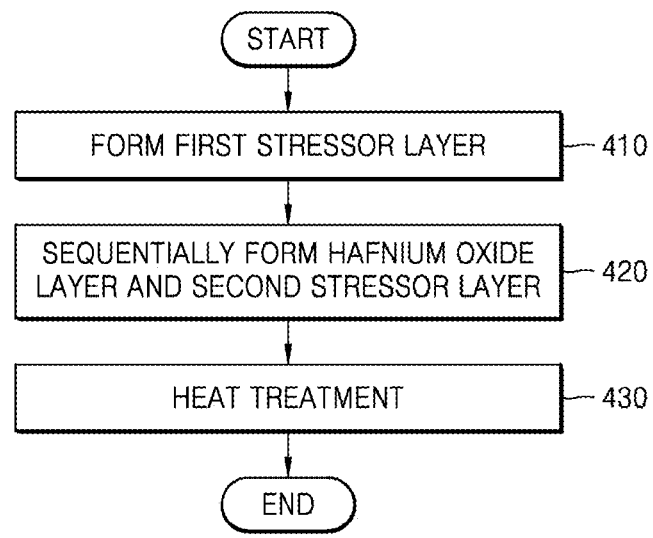
FIG. 4 is a flowchart of a method of manufacturing a film structure including hafnium oxide.

FIG. 4 is a flowchart of a method of manufacturing a film structure 100 including hafnium oxide.

The first stressor layer 130 is formed (S410). The first stressor layer 130 may include at least one of an oxide or a metal. The first stressor layer 130 may be formed on a substrate. The substrate may include at least one material, like a metal or semiconductor, like Al, Si, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, Hf, Ta, W, Re, Os, Ir, Pt, Au, and the like. The substrate may also include a nitride or an oxide, as well as the at least one material. The first stressor layer 130 may be formed by a deposition method such as atomic layer deposition (ALD), chemical vapor deposition (CVD), or physical vapor deposition (PVD). The deposition method may include placing a target substrate in a chamber, heating the chamber to a certain temperature, and supplying a source to deposit a source material on the target substrate.

The hafnium oxide layer 110 and the second stressor layer 150 may be sequentially formed on the first stressor layer 130 (S420). The hafnium oxide layer 110 and the second stressor layer 150 may be also formed by a deposition method such as ALD, CVD, or PVD.

The first stressor layer 130, the hafnium oxide layer 110, and the second stressor layer 150 may be heat-treated (S430). A temperature of the heat treatment may be in a range of about 400° C. to 600° C. The hafnium oxide layer 110 and the first and second stressor layers 130 and 150 may expand due to the heat treatment. Because the coefficients of thermal expansion of the first and second stressor layers 130 and 150 are greater than that of the hafnium oxide layer 110, the first and second stressor layers 130 and 150 may apply compressive stress to the hafnium oxide layer 110. The hafnium oxide in the hafnium oxide layer 110 may be crystallized in the tetragonal phase due to the compressive stress.

Figure 5:
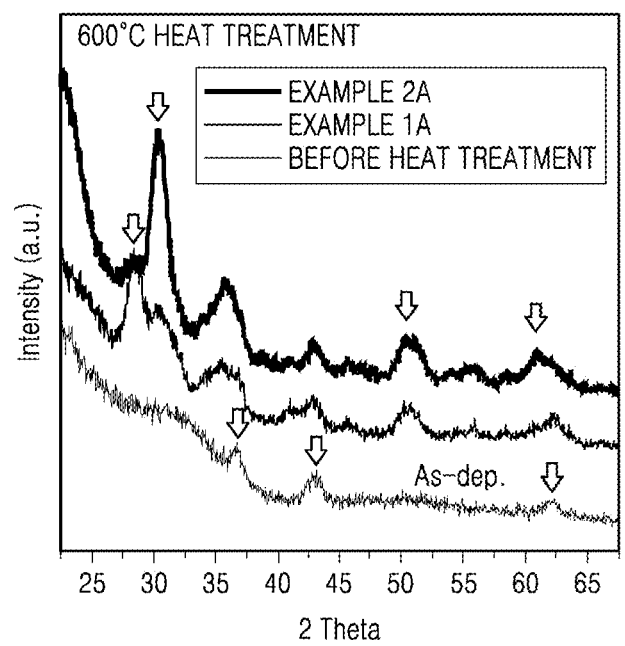
FIG. 5 is a graph showing a result of analyzing atomic concentrations of film structures heat-treated at 600° C.

FIG. 5 is a graph showing a result of analyzing atomic concentrations of film structures heat-treated at 600° C.

A film structure of Example 1A is a structure obtained by forming a first stressor layer and forming a hafnium oxide layer of hafnium dioxide, and a film structure of Example 2A is a structure obtained by forming a first stressor layer of titanium, forming a hafnium oxide layer of hafnium dioxide, and forming a stressor layer of niobium oxide. Thereafter, the film structures were heated to 600° C. Here, thermal expansion coefficients of titanium and niobium oxide are greater than that of hafnium dioxide.

By analyzing the atomic concentration through X-ray diffraction (XRD) analysis, the hafnium oxide layers of Examples 1A and 2A showed peaks at about 30 degrees. This shows that the hafnium oxide layers of the examples were crystallized in the orthorhombic or tetragonal phase. In particular, it means that there was a high degree of the tetragonal phases in the hafnium oxide layer in Example 2A, which shows a high peak intensity at about 30 degrees. A reference graph shows a result of analyzing an atomic concentration before a heat treatment after the structures of Examples 1A and 2A, and illustrates that the tetragonal phases were not formed in the hafnium oxide layer before the heat treatment.

This means that when the stressor layers of a large thermal expansion coefficient are provided at both sides of the hafnium oxide layers, stable tetragonal phase crystals may be obtained despite the heat treatment performed at a relatively low temperature.

Figure 6:
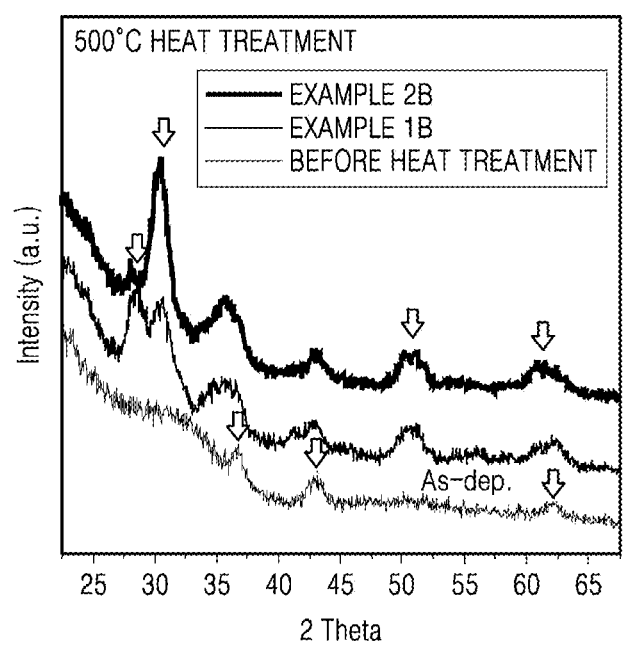
FIG. 6 is a graph showing a result of analyzing atomic concentrations of film structures heat-treated at 500° C.

FIG. 6 is a graph showing a result of analyzing the atomic concentrations of film structures heat-treated at 500° C. A film structure of Example 1B is a structure obtained by forming a first stressor layer and forming a hafnium oxide layer of hafnium dioxide, and a film structure of Example 2B is a structure obtained by forming a first stressor layer of titanium, forming a hafnium oxide layer of hafnium dioxide, and forming a stressor layer of niobium oxide. The film structures were heated at 500° C. Here, thermal expansion coefficients of titanium and niobium oxide are greater than that of hafnium dioxide.

Similarly, by analyzing the atomic concentration through the XRD analysis, the hafnium oxide layers of Examples 1B and 2B heat-treated at 500° C. exhibited peaks at about 30 degrees. This shows that the hafnium oxide layers of the examples 1B and 2B were crystallized in the orthorhombic or tetragonal phase. In particular, it means that there were many tetragonal phases in the hafnium oxide layer in Example 2B showing a high peak intensity at about 30 degrees.

This means that when the stressor layers of a large thermal expansion coefficient are provided at both sides of the hafnium oxide layers, stable tetragonal phase crystals may be obtained even at 500° C. lower than 600° C. Accordingly, a film structure including a tetragonal phase hafnium oxide may be manufactured even at low temperatures.

Figure 7:
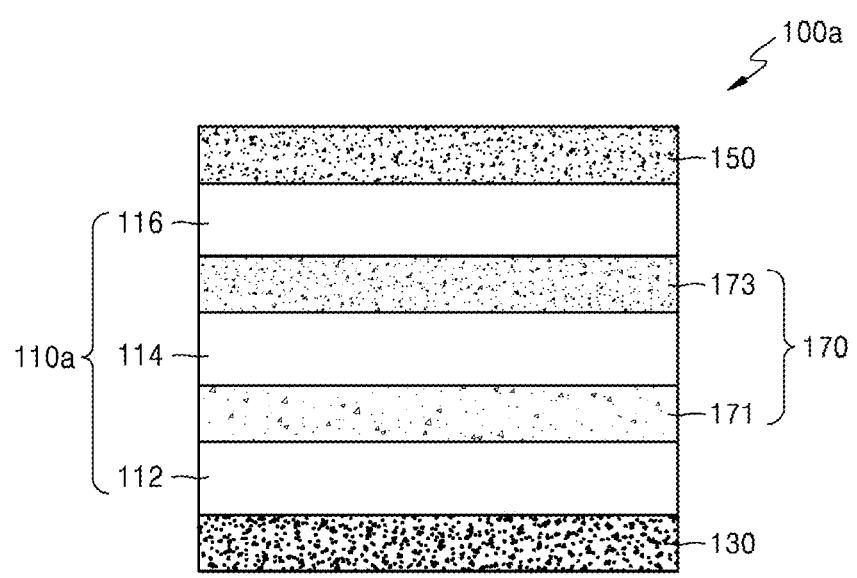
FIG. 7 is a cross-sectional view of a film structure including hafnium oxide according to another embodiment.

FIG. 7 is a cross-sectional view of a film structure 100a including hafnium oxide according to another embodiment. Hafnium oxide layers 110a of FIG. 7 may include a plurality of sub-hafnium oxide layers 112, 114, and 116, which are apart from one another. A thickness of each of the plurality of sub-hafnium oxide layers 112, 114, and 116 may be about 30 Å or less, and the total thickness of the plurality of sub-hafnium oxide layers 112, 114, and 116 may be 7 nm or less.

Each of the sub-hafnium oxide layers 112, 114, and 116 may include crystallized hafnium oxide ($HfO_x$). For example, each of the sub-hafnium oxide layers 112, 114, and 116 may include hafnium dioxide ($HfO_2$). Each of the sub-hafnium oxide layers 112, 114, and 116 may have a high dielectric constant of 30 to 70.

At least one of the sub-hafnium oxide layer 112, 114, or 116 may include hafnium oxide crystallized in the tetragonal phase. A content of the hafnium oxide crystallized in the tetragonal phase may be in a range of 50% to 95% of each of the sub-hafnium oxide layers 112, 114, and 116. As content ratio of the hafnium oxide crystallized in the tetragonal phase increases, the sub-hafnium oxide layers 112, 114, and 116 may maintain a stable state and have a high dielectric constant.

At least one of the sub-hafnium oxide layer 112, 114, or 116 may also include hafnium oxide crystallized in the orthorhombic phase and/or the monoclinic phase. A displacement space between hafnium oxides crystallized into the tetragonal phase may be filled with a hafnium oxides crystallized into the tetragonal phase or the monoclinic phase. A content of the hafnium oxide crystallized in the tetragonal phase and/or the monoclinic phase may be lower than that of the hafnium oxide crystallized in the tetragonal phase. For example, the content of the hafnium oxide crystallized in the tetragonal phase and/or the monoclinic phase may be 20% or less of the hafnium oxide layer 110a.

The hafnium oxide layers 110a may further include a dopant. The dopant may have a smaller ionic radius than that of hafnium ions. For example, the dopant may be ions such as Ti, V, Cr, Mn, Fe, Co, Ni, Cu, Zn, Co, Ge, Nb, Mo, Tc, Ru, Rh, Pd, Sn, Sb, Ta, W, Re, Os, Ir, Pt, Bi, Po, the like, or a combination thereof.

For example, the sub-hafnium oxide layers 112, 114, and 116 may or may not each include a dopant, and each of the sub-hafnium oxide layers 112, 114, and 116 may include different dopants. The dopant may have a smaller ionic radius than that of hafnium ions. For example, the dopant may be ions such as Ti, V, Cr, Mn, Fe, Co, Ni, Cu, Zn, Co, Ge, Nb, Mo, Tc, Ru, Rh, Pd, Sn, Sb, Ta, W, Re, Os, Ir, Pt, Bi, Po, the like, or a combination thereof.

The film structure 100a of FIG. 7 may further include sub-stressor layers 171 and 173 between the hafnium oxide layers 110a, as well as the first and second stressor layers 130 and 150. The sub-stressor layers 171 and 173 may be alternately provided with the sub-hafnium oxide layers 112, 114, and 116 to be in physical contact with the sub-hafnium oxide layers 112, 114, and 116.

The sub-stressor layers 171 and 173 may apply compressive stress to the first and second stressor layers 130 and 150 and the sub-hafnium oxide layers 112, 114, and 116 between the first and second stressor layers 130 and 150. A thermal expansion coefficient of the sub-stressor layers 171 and 173 may be greater than that of the hafnium oxide layers 110a. For example, the thermal expansion coefficient of at least one of the sub-stressor layer 171 or 173 may be 1.5 times or greater than that of the hafnium oxide layer 110a. Alternatively, the thermal expansion coefficient of at least one of the sub-stressor layer 171 or 173 may be 7 μm/K or more.

The sub-stressor layers 171 and 173 may include an oxide, similar to the first and second stressor layers 130 and 150. For example, at least one of the first stressor layer 130 or the second stressor layer 150 may include at least one of a titanium oxide, an iron oxide, a nickel oxide, a cobalt oxide, a chromium oxide, or a combination thereof. The sub-stressor layers 171 and 173 may include a dielectric material. The sub-stressor layers 171 and 173 may perform a dielectric film function, together with the hafnium oxide layers 110a.

By arranging the sub-stressor layers 171 and 173 between the hafnium oxide layers 110a as described above, the hafnium oxides in the hafnium oxide layers 110a may be crystallized in the tetragonal phase of higher content ratio.

FIG. 7 illustrates three sub-hafnium oxide layers 112, 114, and 116 and two sub-stressor layers 171 and 173 but embodiments are not limited thereto. The number of sub-hafnium oxide layers and the number of sub-stressor layers may vary.

Figure 8:
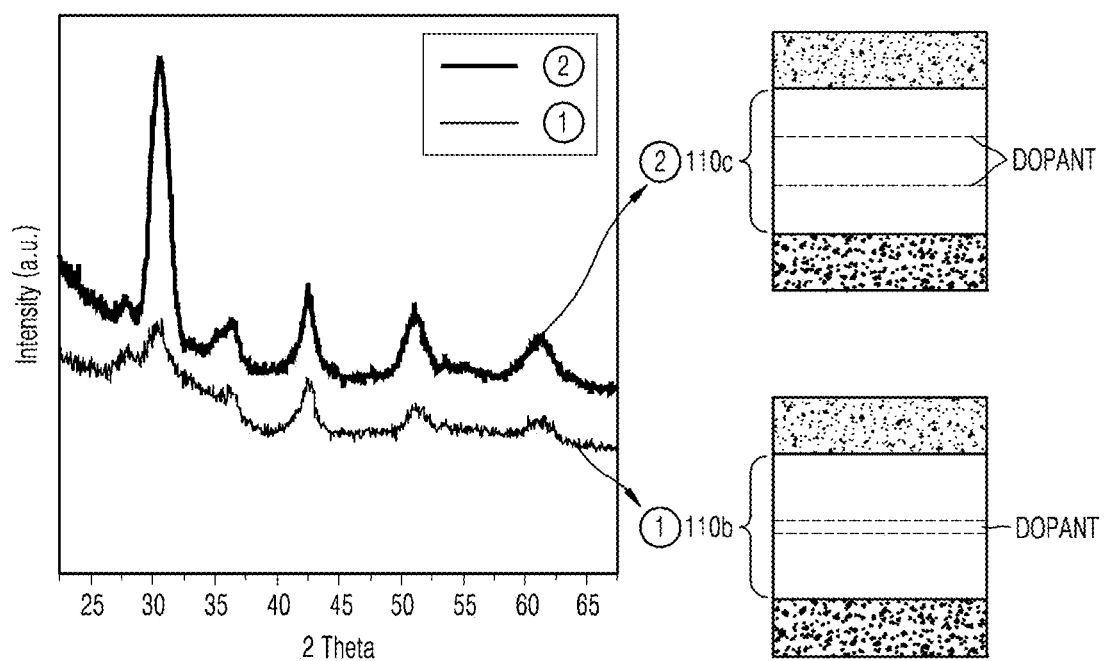
FIG. 8 is a graph showing a result of analyzing atomic concentrations of hafnium oxide layers according to a position of a dopant added, according to an embodiment.

When a dopant is added to the hafnium oxide layers, the dopant may be evenly distributed over the hafnium oxide layers. FIG. 8 is a graph showing a result of analyzing atomic concentrations of hafnium oxide layers according to a position of a dopant added, according to an embodiment.

Example ① is a result of analyzing an atomic concentration of a structure heated after two dopant layers were added to a center region of a hafnium oxide layer 110b, and Example ② is a result of analyzing an atomic concentration of a structure heated after a dopant was added to a region of ⅓ of the height of a hafnium oxide layer 110c and a region of ⅔ of the height of the hafnium oxide layer 110c. A peak appeared at about 30 degrees in both the hafnium oxide layers 110b and 110c of Examples ① and ②. This shows that the hafnium oxide layers 110b and 110c of Examples ① and ② were crystallized in the orthorhombic and/or tetragonal phase. In particular, the intensity of a peak at about 30 degrees is stronger in Example ②. This means that there was a higher degree of the tetragonal phases in the hafnium oxide layer 110c of Example ②. That is, a hafnium oxide layer with a higher degree of tetragonal phases may be obtained by evenly depositing a dopant on the hafnium oxide layer over the entire hafnium oxide layer.

Figure 9:
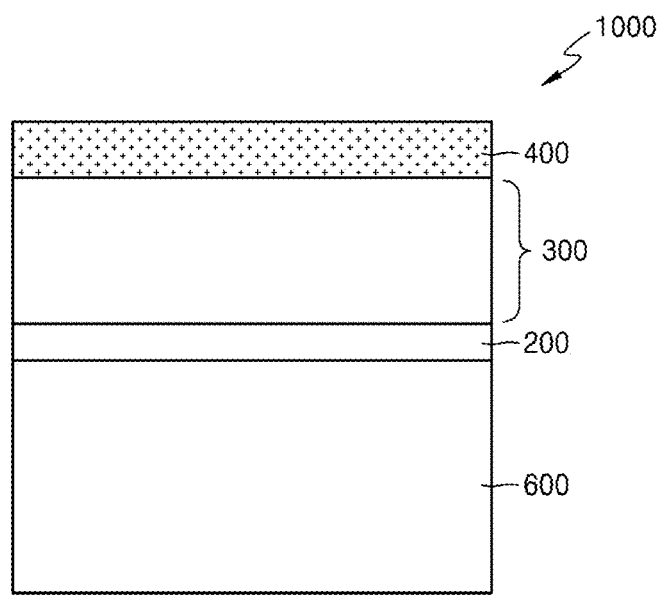
FIG. 9 is a schematic cross-sectional view illustrating a structure of an electronic device according to an embodiment.

FIG. 9 is a schematic cross-sectional view illustrating a structure of an electronic device 1000 according to an embodiment.

The electronic device 1000 may include a semiconductor layer 600, an insulating layer 200 on the semiconductor layer 600, a dielectric layer 300 on the insulating layer 200, and a first conductive layer 400 on the dielectric layer 300.

The semiconductor layer 600 may include a semiconductor substrate (not illustrated). The semiconductor substrate may include a silicon substrate, a germanium substrate, or a silicon-germanium substrate. The semiconductor layer 600 may include at least material, like a metal or semiconductor, for example one of Al, Si, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, Hf, Ta, W, Re, Os, Ir, Pt, Au, and the like, or may include a nitride or an oxide, as well as the at least one material.

The insulating layer 200 may include a layer for suppressing or preventing electrical leakage. For example, the insulating layer 200 may include an insulating oxide like Si oxide ($SiO_x$), Al oxide ($AlO_x$), Hf oxide ($HfO_x$), Zr oxide ($ZrO_x$), or a two-dimensional (2D) insulator may be used as the insulating layer 200. A material such as hexagonal boron nitride (h-BN) may be used as the 2D insulator. The insulating layer may be an oxide of the semiconductor layer 600. However, a material of the insulating layer 200 is not limited thereto.

The dielectric layer 300 may be any one of the film structures 100 and 100a including the hafnium oxide described above. The first and second stressor layers 130 and 150 of the film structures 100 and 100a may be formed of a dielectric material having a thermal expansion coefficient greater than that of the hafnium oxide in the hafnium oxide layers 110 through 110c. The dielectric layer 300 may function as a ferroelectric domain switching layer.

The first conductive layer 400 may include a metal including TiN, W, Mo, Ni, or the like; a conductive oxide including $RuO_2$, $SrRuO_3$, ITO, or the like; a 2D material including graphene; or a combination thereof. The first conductive layer 400 may also include a metal nitride or a metal oxynitride.

The first conductive layer 400 may be, for example, a gate electrode. A source electrode (not shown) and a drain electrode (not shown) may be connected to the semiconductor layer 600. A source region (not shown) and a drain region (not shown) may be provided on the semiconductor layer 600, and a source electrode and a drain electrode may be respectively connected thereto. A region of the semiconductor layer 600 between the source region and the drain region may be a channel region.

The second stressor layer 150 of each of the film structures 100 and 100a may be formed of a conductive material having a thermal expansion coefficient greater than that of each of the hafnium oxide layers 110 and 100a. In this case, the second stressor layer 150 may serve as the first conductive layer 400 and thus the first conductive layer 400 may not be additionally provided. Though the sidewalls of the electronic device 1000 are illustrated as coplanar, the sidewalls of the first conductive layer 400, the dielectric layer 300, the insulating layer 200, and/or the semiconductor layer 600 may not be coplanar to each other. For example, the semiconductor 600 may extend past the electronic device 1000 such that semiconductor substrate included in the semiconductor layer 600 is a substrate for other electronic devices (not illustrated), the insulating layer 200 may be patterned to define insulating regions on an integrated device, and/or the first conductive layer 400 may be patterned as electrodes and/or wiring patterns.

The electronic device 1000 may be, for example, a logic transistor.

Figure 10:
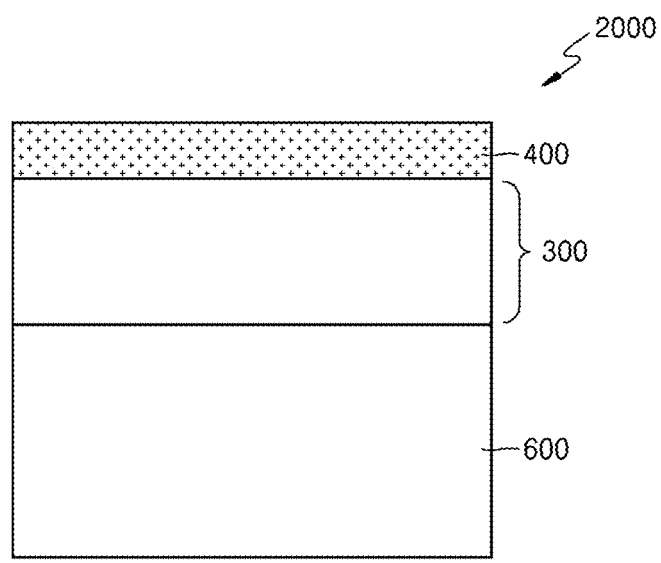
FIG. 10 is a schematic cross-sectional view illustrating a structure of an electronic device according to another embodiment.

FIG. 10 is a schematic cross-sectional view illustrating a structure of an electronic device 2000 according to another embodiment.

The electronic device 2000 of the present embodiment may be substantially the same as the electronic device 1000 of FIG. 9, except that the electronic device 2000 does not include an insulating layer.

Figure 11:
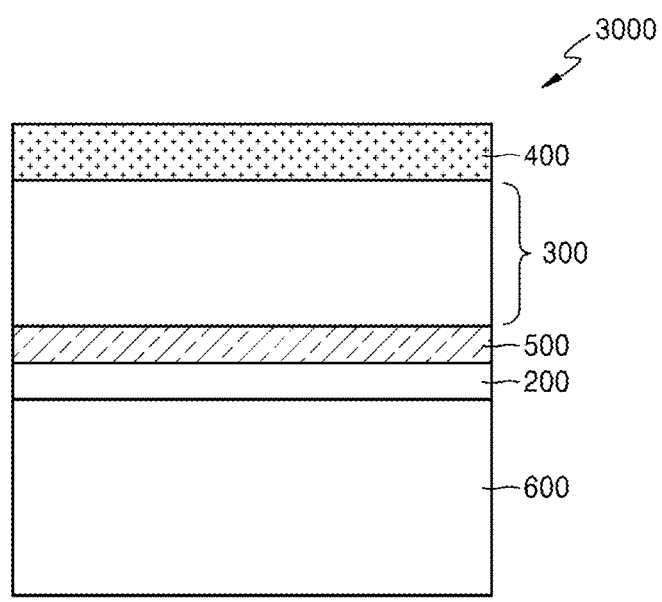
FIG. 11 is a schematic cross-sectional view illustrating a structure of an electronic device according to another embodiment.

FIG. 11 is a schematic cross-sectional view illustrating a structure of an electronic device 3000 according to another embodiment.

The electronic device 3000 of the present embodiment is substantially the same as the electronic device 1000 of FIG. 9, except that a second conductive layer 500 is further provided between an insulating layer 200 and a dielectric layer 300. The first stressor layers 130 of each of the film structures 100 and 100a may be formed of a conductive material having a thermal expansion coefficient greater than that of the hafnium oxide layers 110 and 100a. In this case, the first stressor layer 130 may serve as a second conductive layer, and thus, a second conductivity may not be provided.

The electronic devices 1000, 2000, and 3000 of FIGS. 9 to 11 may further comprise source and drain electrodes (not shown) and, for example, function as transistor devices.

Figure 12:
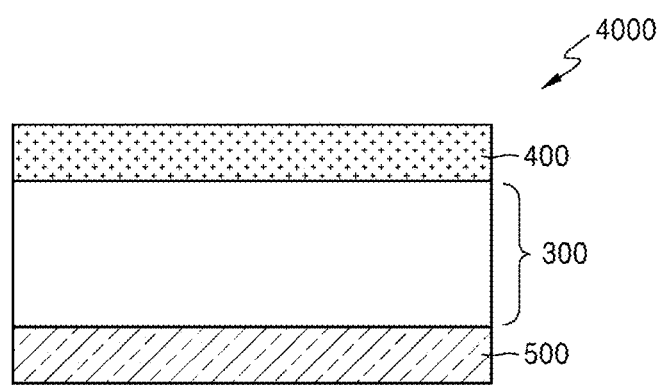
FIG. 12 is a schematic cross-sectional view illustrating a structure of an electronic device according to another embodiment.

FIG. 12 is a schematic cross-sectional view illustrating a structure of an electronic device 4000 according to another embodiment.

The electronic device 4000 includes a second conductive layer 500, a dielectric layer 300 on the second conductive layer 500, and a first conductive layer 400 on the dielectric layer 300. The dielectric layer 300 may be the film structure 100 or 100a including hafnium oxide. The first and second stressor layers 130 and 150 of the film structures 100 and 100a may be formed of a conductive material having a thermal expansion coefficient greater than that of the hafnium oxide layers 110 and 110a. In this case, the first stressor layer 130 serves as the second conductive layer 500 and the second stressor layer 150 serves as the first conductive layer 400 and thus the first and second conductive layers 400 and 500 may not be provided.

The first and second conductive layers 400 and 500 may be patterned, for example as electrodes or wiring patterns, wherein one of the first or second conductive layers 400 or 500 is a storage electrode and the other is a contact electrode connected to a transistor (not illustrated). Thus, the dielectric layer 300 may be a dielectric layer in a dynamic random access memory (DRAM) device. Further, as the dielectric layer 300 may exhibit ferroelectric properties, the DRAM device may be a ferroelectric RAM (FRAM), wherein the dielectric layer 300 is a ferroelectric storage layer. A storage structure of the FRAM including the electronic device 4000, though illustrated as a stack of linear structures, may exhibit other shapes, for example, the first and second conductive layers 400 and 500 may not entirely cover the surfaces of the dielectric layer 300 and/or the electronic device 4000 may include a trench-like structure such that electronic device is included as a part of a trench-type FRAM memory region and/or device, for wherein the sidewalls of the first and second conductive layers 400 and 500 are not coplanar with the sidewalls of the dielectric layer 300.

Figure 13:
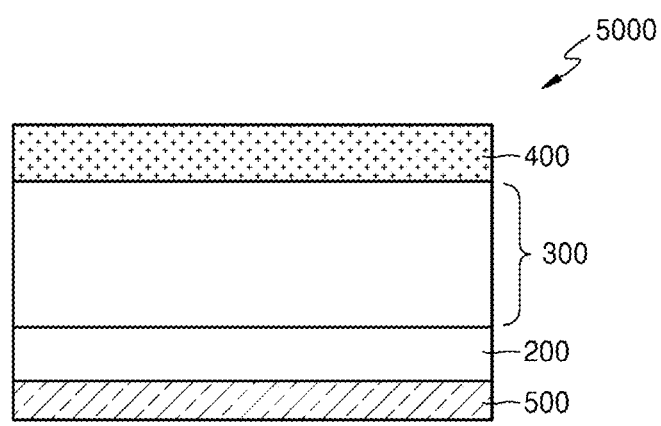
FIG. 13 is a schematic cross-sectional view illustrating a structure of an electronic device according to another embodiment.

FIG. 13 is a schematic cross-sectional view illustrating a structure of an electronic device 5000 according to another embodiment.

The electronic device 5000 of the present embodiment is substantially the same as the electronic device 4000 of FIG. 12, except that an insulating layer 200 is further provided between a second conductive layer 500 and a dielectric layer 300. In this case, the first stressor layer 130 of each of the film structures 100 and 100a may be formed of a dielectric material having a thermal expansion coefficient greater than that of the hafnium oxide layers 110 and 110a.

The electronic devices 4000 and 5000 of FIGS. 12 and 13 may be, for example, capacitors and include a dielectric layer 300 having a high dielectric constant and, thus, may exhibit high capacitance.

Figure 14A:
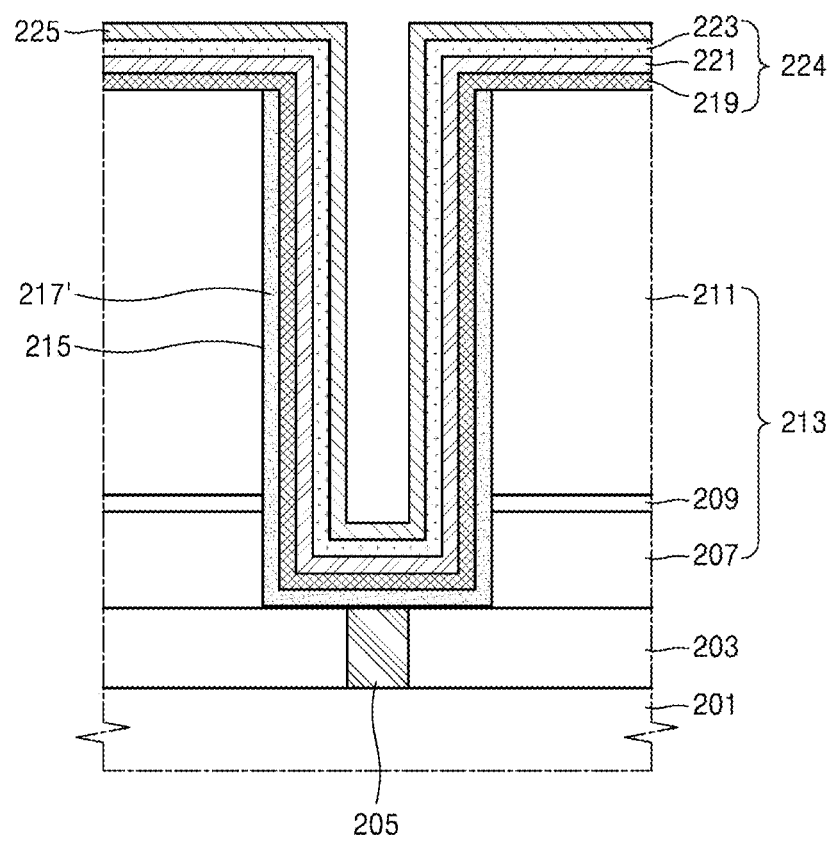
FIG. 14A illustrates a structure of a metal-insulator-metal (MIM) capacitor according to an embodiment.

FIG. 14A illustrates a structure of a metal-insulator-metal (MIM) capacitor according to an embodiment.

An interlayer insulating film 203 may be stacked on a semiconductor substrate 201. A contact plug 205 may be formed to fill a contact hole through which the semiconductor substrate 201 is exposed. A mold insulating film 213 may be formed on the semiconductor substrate having the contact plug 205. As illustrated in FIG. 14A, the mold insulating film 213 may have a structure in which a lower mold insulating film 207, an etch stop film 209, and an upper mold insulating film 211 are sequentially stacked on the semiconductor substrate having the contact plug 205. However, the example embodiments are not so limited, for example the etch stop film 209 may be formed directly on an upper surface of the contact plug 205 and the interlayer insulating film 203. In other embodiments, the mold insulating film 213 may be formed as a double-layered mold insulating film including the lower mold insulating film 207 and the upper mold insulating film 211, or as a single mold insulating film. The lower mold insulating film 207 and the upper mold insulating film 211 may have an etch selectivity with respect to the etch stop film 209. For example, when the lower mold insulating film 207 and the upper mold insulating film 211 are formed of a silicon oxide film, the etch stop film 209 may be formed of a silicon nitride film. A storage node hole 215 which exposes the upper surface of the contact plug 205 and the upper surface of the interlayer insulating film 203 adjacent to the contact plug 205 may be formed by patterning the mold insulating film 213.

A conductive film may be formed on the entire surface of the semiconductor substrate having the storage node hole 215. The conductive film may be formed as a conductive film having excellent step coverage, resistance to deformation during a subsequent dielectric film forming process, and resistance to oxidation. For example, the conductive film may be formed of at least one metal nitride film (e.g., a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN), and a tungsten nitride film (WN)). The conductive film may be etched to be isolated in the storage node hole 150, forming a lower electrode 217'.

A buffer insulating film (not illustrated) may also be formed on the lower electrode conductive film. The lower electrode 217' isolated in the storage node hole 215, and a buffer insulating film pattern isolated in the storage node hole 215 may be formed. The buffer insulating film pattern may be selectively removed to have a structure exposing the inner wall of the lower electrode. A dielectric film 224 in which a lower dielectric film 219 and an upper dielectric film 223 are sequentially stacked on the entire surface of the semiconductor substrate 201 having the lower electrode 217' may be formed. The lower dielectric film 219 and the upper dielectric film 223 may be the dielectric monolayer thin film according to any of the embodiments. In particular, the upper and the lower dielectric layer 219 dielectric film 223 may be either the first and/or second stressor layer with an intermediate dielectric film 221 interposed between. The intermediate dielectric film 221 may be, for example, a hafnium oxide layer including hafnium oxide in a tetragonal crystalline phase.

An upper electrode 225 may be formed on the upper dielectric film 223. The upper electrode 225 may be formed of a metal film having a larger work function than that of the lower electrode 217'.

For example, the upper electrode 225 may be formed of at least one noble metal film (e.g., a Ru film, a Pt film, and/or an Ir film), a $Ta_2O_5$ film, a $TiO_2$ film, a doped $TiO_2$ film, and/or a STO film. The lower dielectric film 219 may be formed of at least one of a $HfO_2$ film, a $ZrO_2$ film, an $Al_2O_3$ film, and/or a $La_2O_3$ film.

The MIM capacitor of FIG. 14A may have a concave structure or a cylindrical structure.

Figure 14B:
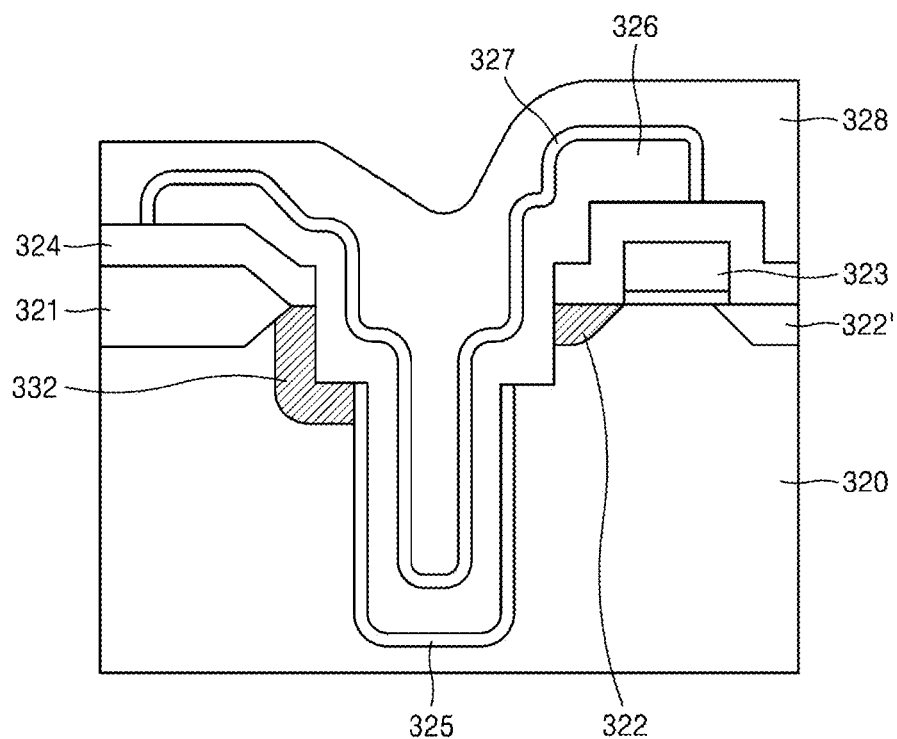
FIG. 14B illustrates a structure of a trench capacitor-type dynamic random access memory (DRAM).

FIG. 14B illustrates a structure of a trench capacitor-type dynamic random access memory (DRAM).

Referring to FIG. 14B, on a P-type semiconductor substrate 320, a device isolation region may be defined with a field oxide film 321, and a gate electrode 323 and source/drain impurity regions 222 and 222' may be formed in the device isolation region. A high-temperature oxide (HTO) film may be formed as an interlayer insulating film 324. A region not to be a trench may be capped with a trench buffer layer, and a part of the source region 322 may be open to form a contact portion.

A trench is formed in a sidewall of the interlayer insulating film 324, and a sidewall oxide film 325 may be formed over the entire sidewall of the trench. The sidewall oxide film 325 may compensate for damage in the semiconductor substrate caused by etching to form the trench, and may also serve as a dielectric film between the semiconductor substrate 320 and a storage electrode 326. A sidewall portion of part of the source region 322, except for the other part of the source region near the gate electrode 323, may be entirely exposed.

A PN junction (not illustrated) may be formed in the sidewall portion of the source region by impurity implantation. The trench may be formed in the source region 322. A sidewall of the trench near the gate may directly contact the source region 322, and the PN junction may be formed by additional impurity implantation into the source region.

A storage electrode 326 may be formed on part of the interlayer insulating film 324, the exposed source region, and the surface of the sidewall oxide film 325 in the trench. The storage electrode may be, for example, an embodiment of the film structure with a hafnium oxide layer between two stressor layers, and may be formed so as to contact the entire source region 322 in contact with the upper sidewall of the trench, in addition to the part of the source region 322 near the gate electrode. Next, an insulating film 327 as a capacity dielectric film may be formed along the upper surface of the storage electrode 326, and a polysilicon layer as a plate electrode 328 may be formed thereon, thereby completing a trench capacitor type DRAM.

As the storage electrode 326, the polysilicon layer may be formed on the part of the interlayer insulating film 324, the exposed source region 322, and the surface of the sidewall oxide film 325 in the trench. Since the storage electrode 326 is formed to spontaneously contact, in addition to the part of the source region 322 near the gate electrode, the entire source region 322 in contact with the upper sidewall of the trench, the contact area may be enlarged, leading to more reliable contact with the storage electrode 326 and a significant increase in capacitance of the capacitor.

The electronic devices 1000, 2000, 3000, 4000, and 5000 described above may also comprise an integrated device. The integrated device may be, for example, part of a silicon-based integrated circuit, and the integrated circuit may include capacitors, transistors, memory devices, and the like. Such a device may have a dielectric layer having a high dielectric constant or ferroelectric properties, thereby achieving high performance and miniaturization.

The film structures 100 and 100a, the manufacturing methods thereof, and the electronic device have been described above with reference to the embodiments illustrated in the drawings but are only examples, and it will be apparent to those of ordinary skill in the art that various modifications may be made and other equivalent embodiments may be derived. While many matters have been described above in detail, they should be construed as illustrative of certain embodiments rather than limiting the scope of the present disclosure. Therefore, the scope of the present disclosure should be determined not by the embodiments set forth herein but by the technical spirit described in the claims.

According to the structures and the manufacturing methods described above, a dielectric layer having good stability and high dielectric constant is provided.

The above-described film structures may be employed in various types of electronic devices such as transistors, capacitors, integrated circuit devices, etc., and such electronic devices may exhibit good operating performance.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A film structure including hafnium oxide, the film structure comprising:
   a first stressor layer;
   a hafnium oxide layer on the first stressor layer, the hafnium oxide layer including hafnium oxide crystallized in a tetragonal phase; and
   a second stressor layer on the hafnium oxide layer, the first stressor layer and the second stressor layer configured to apply compressive stress to the hafnium oxide layer during heating,
   wherein both of the first stressor layer and the second stressor layer have a thermal expansion coefficient greater than a thermal expansion coefficient of the hafnium oxide layer such that, as both the first stressor layer and the second stressor layer expand while heat is being applied, both of the first stressor layer and the second stressor layer compress the hafnium oxide layer.

2. The film structure of claim 1, wherein the hafnium oxide crystallized in the tetragonal phase is about 50% to 95% of the hafnium oxide layer.

3. The film structure of claim 1, wherein the hafnium oxide layer further comprises hafnium oxide crystallized in at least one of an orthorhombic phase or a monoclinic phase.

4. The film structure of claim 3, wherein the hafnium oxide crystallized in the at least one of the orthorhombic phase or the monoclinic phase is 20% or less of the hafnium oxide layer.

5. The film structure of claim 1, wherein the thermal expansion coefficient of the at least one of the first stressor layer or the second stressor layer is 1.5 times or greater than the thermal expansion coefficient of the hafnium oxide layer.

6. The film structure of claim 1, wherein the thermal expansion coefficient of the at least one of the first stressor layer or the second stressor layer is 7 μm/K or greater.

7. The film structure of claim 1, wherein at least one of the first stressor layer or the second stressor layer comprise at least one of titanium oxide, iron oxide, nickel oxide, cobalt oxide, or chromium oxide.

8. The film structure of claim 1, wherein each of the first stressor layer and the second stressor layer is in direct contact with the hafnium oxide layer.

9. The film structure of claim 1, wherein at least one of the first stressor layer or the second stressor layer comprises a conductive material.

10. The film structure of claim 1, wherein at least one of the first and second stressor layers have a thickness less than that of the hafnium oxide layer.

11. The film structure of claim 9, wherein the at least one of the first and second stressor layers has a thickness of 2 nm or less.

12. The film structure of claim 1, wherein the hafnium oxide layer has a thickness of about 5 to 7 nm.

13. The film structure of claim 1, wherein the hafnium oxide layer includes a dopant with an ionic radius lower than that of hafnium ions.

14. The film structure of claim 13, wherein the dopant comprises at least one ion of Li, Be, Mg, Al, Si, Ti, V, Cr, Mn, Fe, Co, Ni, Cu, Zn, Co, Ge, Nb, Mo, Tc, Ru, Rh, Pd, Sn, Sb, Ta, W, Re, Os, Ir, Pt, Bi, or Po.

15. The film structure of claim 1, wherein the hafnium oxide layer has a dielectric constant of about 30 to 70.

16. An electronic device comprising:
an electrode; and
the film structure of claim 1 on the electrode.

17. The electronic device of claim 16, wherein the electrode comprises a metal material.

18. The electronic device of claim 16, wherein the electronic device comprises at least one of a capacitor or a transistor.

19. A method of manufacturing a film structure, the method comprising:
forming a first stressor layer;
forming a hafnium oxide layer on the first stressor layer, the hafnium oxide layer including hafnium oxide;
forming a second stressor layer on the hafnium oxide layer, the second stressor layer apart from the first stressor with the hafnium oxide layer therebetween, the first and second stressor layers having thermal expansion coefficients greater than a thermal expansion coefficient of the hafnium oxide layer; and
heat-treating the first stressor layer, the hafnium oxide layer, and the second stressor layer such that, as the first stressor layer and the second stressor layer expand during a heating step, the first and second stressor layers apply compressive stress to the hafnium oxide layer.

20. The method of claim 19, wherein the heat-treating of the first stressor layer, the hafnium oxide layer, and the second stressor layer comprises heating the first stressor layer, the hafnium oxide layer, and the second stressor layer to between about 400° C. and 600° C.

21. The method of claim 19, wherein at least part of the hafnium oxide of the heat-treated hafnium oxide layer is crystallized in a tetragonal phase.

22. The method of claim 21, wherein the hafnium oxide crystallized in the tetragonal phase is about 50% to 95% of the hafnium oxide layer.

23. The method of claim 19, wherein the heat-treated hafnium oxide layer includes at least one of an orthorhombic phase or a monoclinic phase.

24. The method of claim 23 wherein the at least one of the orthorhombic phase or the monoclinic phase of the hafnium oxide comprises 20% or less of the hafnium oxide layer.

25. The method of claim 19, wherein at least one of the thermal expansion coefficients of the first and second stressor layers is 1.5 times or greater than the thermal expansion coefficient of the hafnium oxide layer.

26. The method of claim 19, wherein the thermal expansion coefficients of at least one of the first and second stressor layers is 7 µm/K or greater.

* * * * *